US008625734B2

(12) United States Patent
Choi et al.

(10) Patent No.: US 8,625,734 B2
(45) Date of Patent: Jan. 7, 2014

(54) COUNTING CIRCUIT OF SEMICONDUCTOR DEVICE AND DUTY CORRECTION CIRCUIT OF SEMICONDUCTOR DEVICE USING THE SAME

(75) Inventors: Hae-Rang Choi, Gyeonggi-do (KR); Yong-Ju Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 75 days.

(21) Appl. No.: 13/366,425

(22) Filed: Feb. 6, 2012

(65) Prior Publication Data

US 2013/0033294 A1 Feb. 7, 2013

(30) Foreign Application Priority Data

Aug. 3, 2011 (KR) ........................ 10-2011-0077463

(51) Int. Cl.
*H03K 21/00* (2006.01)
(52) U.S. Cl.
USPC ............................................ 377/39; 327/291

(58) Field of Classification Search
None
See application file for complete search history.

(56) References Cited

U.S. PATENT DOCUMENTS

| 5,428,654 A * | 6/1995 | Baqai ............................... 377/34 |
| 7,508,332 B2 * | 3/2009 | Jeong et al. .................... 341/164 |
| 8,456,932 B2 * | 6/2013 | An ............................ 365/189.16 |

* cited by examiner

*Primary Examiner* — Cassandra Cox
(74) *Attorney, Agent, or Firm* — IP & T Group LLP (57) ABSTRACT

A counting circuit of a semiconductor device includes a plurality of counting units configured to count respective bits of counting codes in response to a plurality of counting clocks, respectively, and to control in a counting direction in response to a counting control signal; a clock toggling control unit configured to control the number of counting clocks that toggle among the plurality of counting clocks in response to clock control signals; and a counting operation control unit configured to compare a value of target codes and a value of the counting codes, and to determine a value of the counting control signal according to a comparison result.

24 Claims, 8 Drawing Sheets

COUNTING CIRCUIT OF SEMICONDUCTOR DEVICE AND DUTY CORRECTION CIRCUIT OF SEMICONDUCTOR DEVICE USING THE SAME

CROSS-REFERENCE TO RELATED APPLICATIONS

The present application claims priority of Korean Patent Application No. 10-2011-0077463, filed on Aug. 3, 2011, which is incorporated herein by reference in its entirety.

BACKGROUND

1. Field

Exemplary embodiments of the present invention relate to semiconductor devices, and more particularly, to a counting circuit of a semiconductor device and a duty correction circuit of a semiconductor device that are implemented to the counting circuit of a semiconductor device.

2. Description of the Related Art

The duty cycle of a clock is the ratio of the duration that an input clock is at a high logic level, or a low logic level, to the total period of the input clock signal. A circuit for detecting the duty cycle of an input clock generates a value indicating that the duty of a period is larger or smaller than 50%, and a duty correction circuit performs an operation to correct the duty cycle of the input clock by using the value determined by the duty cycle detecting circuit to set the duty cycle of the input clock to 50%. The duty correction circuit controls the values of duty correction codes in response to the output signal of the circuit for detecting the duty cycle and drives the duty cycle so that the duty cycle of the input clock becomes 50%. More specifically, the duty correction circuit corrects the duty cycle of the input clock to a 50% duty cycle by controlling the values of the duty correction codes.

The duty correction codes may be controlled by, for example, a binary search method and a linear search method. The method used in a duty correction circuit is selected depending upon the locking time and the realization difficulty of the duty correction circuit and the size of an error likely to occur during an operation. In general, the binary search method has a short locking time, and the linear search method is realized easily.

First, in the binary search method, the values of the duty correction codes are changed by the unit of an exponent of 2 in a duty correction operation so that the duty cycle of the input clock becomes 50%.

Figure 1:
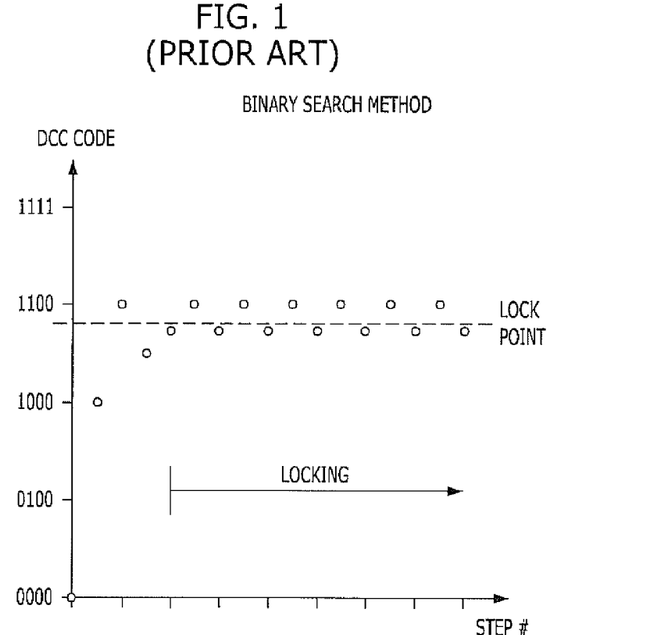
FIGS. 1 and 3 are graphs illustrating the values of duty correction codes according to the operation of a conventional duty correction circuit of a semiconductor device.
Figure 2:
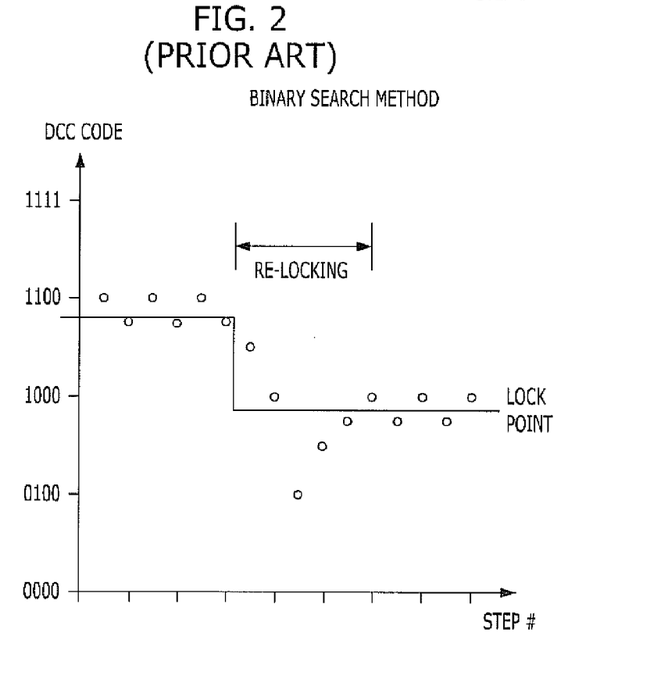
FIGS. 2 and 4 are graphs illustrating the duty correction codes for re-locking the input clock in the conventional duty correction circuit of a semiconductor device.

More specifically, a process of initially correcting a duty error in the duty correction operation according to the binary search method is shown in FIG. 1. Assuming that the duty correction codes are composed of N bits, a duty error may be corrected by repeating a cycle N times. The duty error may be corrected in less than N cycles, but correcting the duty error in N cycles is the longest locking time. In this way, the locking time is short since the values of the duty correction codes in the duty correction operation are changed by a substantial amount. However, after the duty cycle of the input clock is corrected to 50% in the initial duty correction operation, the binary search method has a disadvantage because a substantial amount of change in the values of the duty cycle correction codes occurs even to detect a fine duty error. More specifically, as shown in FIG. 2, when performing an operation for to correct the error after the duty cycle of the input clock is corrected to 50%, a duty error is large while changing the values of the duty correction codes. The size of the duty error likely to occur during this process corresponds, at the maximum, to the value of the most significant bit of the duty correction codes, and increases as the correction range of the duty correction circuit increases.

Figure 3:
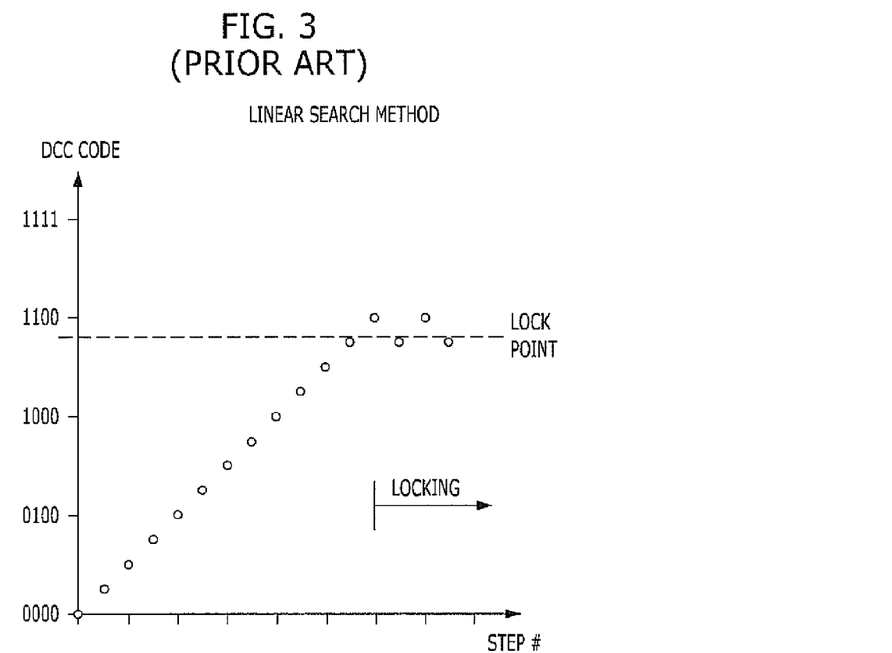

Next, in the linear search method, the values of the duty correction codes are changed by the unit of the least significant bit in a duty correction operation so that the duty cycle of the input clock becomes 50%. A process of initially correcting a duty error according to the linear search method is shown in FIG. 3. Assuming that the duty correction codes are codes composed of N bits, a locking time in the linear search method becomes long due to the fact that a duty error may be corrected by repeating a cycle $2^N$ times.

Figure 4:
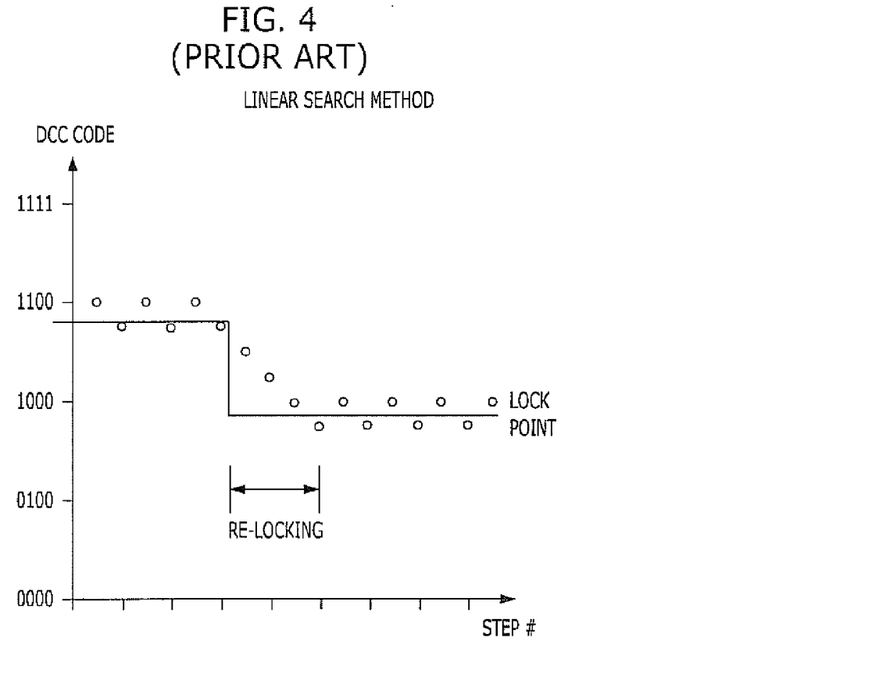

More specifically, as shown in FIGS. 3 and 4, the linear search method has a disadvantage because the locking time is very long because the duty correction codes change by a small amount. However, the duty correction operation can be performed easily and quickly during an operation to correct the duty error occurring after the input clock was initially corrected to 50%.

To overcome the disadvantages described above, a circuit may be designed to implement both the binary search method and the linear search method. The circuit may select which of the two correction methods are selected for correcting the duty error. Nevertheless, a circuit implementing both the binary search method and the linear search method may have additional complexity.

SUMMARY

Embodiments of the present invention are directed to a counting circuit that can selectively use various algorithms in an operation for matching the values of digital codes while occupying a minimal area, and a duty correction circuit with the counting circuit applied thereto.

In accordance with an embodiment of the present invention, a counting circuit of a semiconductor device includes: a plurality of counting units configured to count respective bits of counting codes in response to a plurality of counting clocks, respectively, and to control in a counting direction in response to a counting control signal; a clock toggling control unit configured to control the number of counting clocks that toggle among the plurality of counting clocks in response to clock control signals; and a counting operation control unit configured to compare a value of target codes and a value of the counting codes, and to determine a value of the counting control signal according to a comparison result.

In accordance with another embodiment of the present invention, a duty correction circuit of a semiconductor device includes: a duty cycle error detection unit configured to detect a duty cycle error of a source clock; a plurality of counting units configured to count respective bits of duty correction codes in response to a plurality of counting clocks, respectively, and a counting direction of the plurality of counting units is controlled in response to an output signal of the duty cycle error detection unit; a clock toggling control unit configured to control the number of counting clocks that toggle among the counting clocks in response to clock control signals; and a duty cycle control unit configured to control a duty cycle of the source clock in response to the duty correction codes.

In accordance with another embodiment of the present invention, a method for operating a counting circuit of a semiconductor device includes: initializing toggling by toggling an initial number of counting clocks selected among a plurality of counting clocks according to clock control signals corresponding to a source clock and deactivating remaining counting clocks; performing a toggling operation by toggling sequentially counting clocks in a deactivated state by the initializing of the toggling among the counting clocks each time the number of toggling times of the source clock reaches a operation defined number and by toggling all of the counting clocks when a preset condition is satisfied; counting respective bits of counting codes in response to the counting clocks, respectively, the counting codes being selected in a counting direction thereof according to a counting control signal; and comparing a value of the counting codes and a value of target codes and determining a value of the counting control signal according to a comparison result.

Thanks to the above-described embodiments of the present invention, various methods for changing the values of counting codes until the values reach preset target values, that is, a linear search method and a binary search method, can be selectively used in the same circuit through a way of selectively providing operation clocks to a code counting circuit.

Due to this fact, it is possible to take only the advantages of the various methods for changing the values of counting codes until the values reach preset target values, and the probability of an error to occur during an operation may be minimized.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5A:
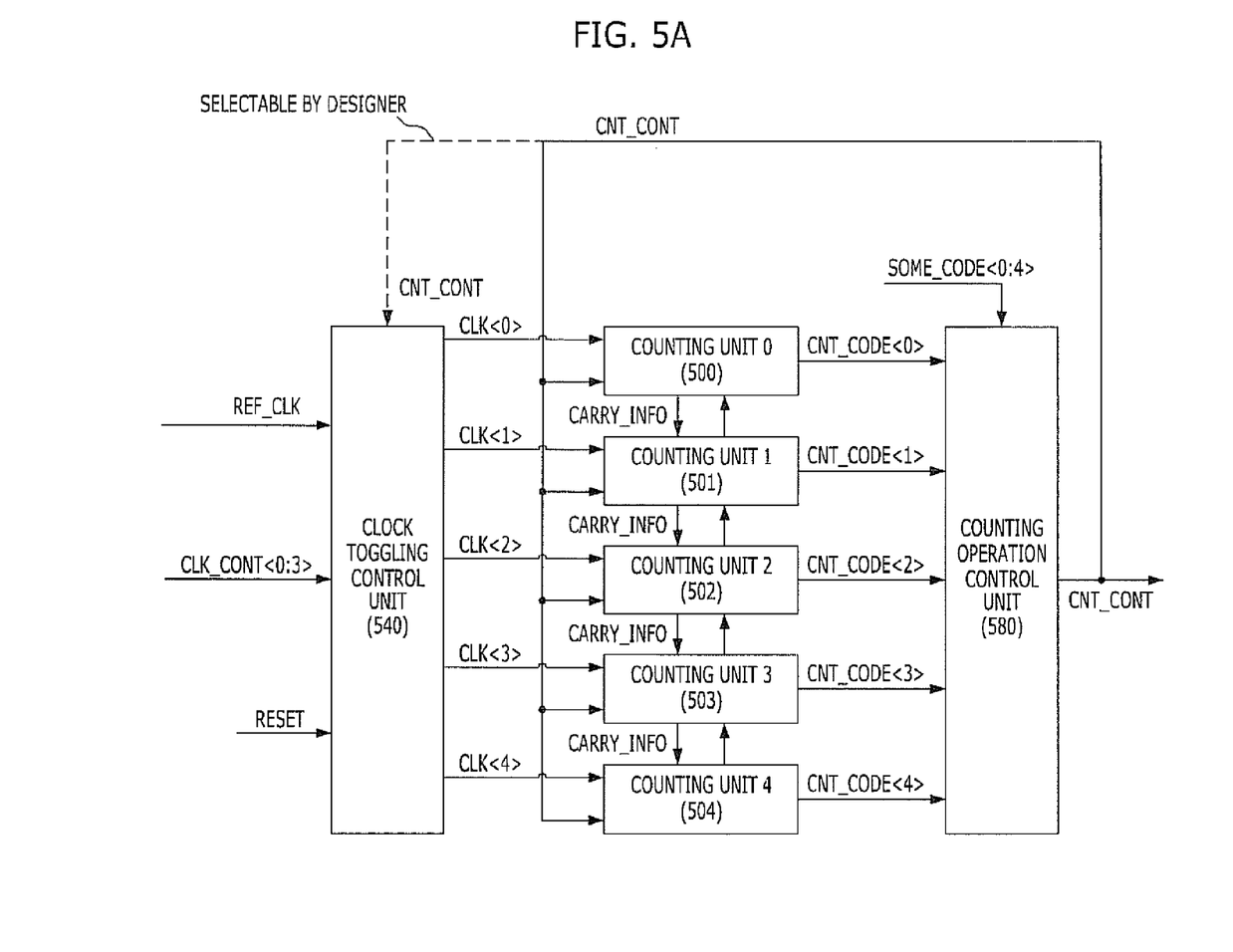
FIG. 5A is a block diagram showing a counting circuit of a semiconductor device in accordance with an embodiment of the present invention.
Figure 5B:
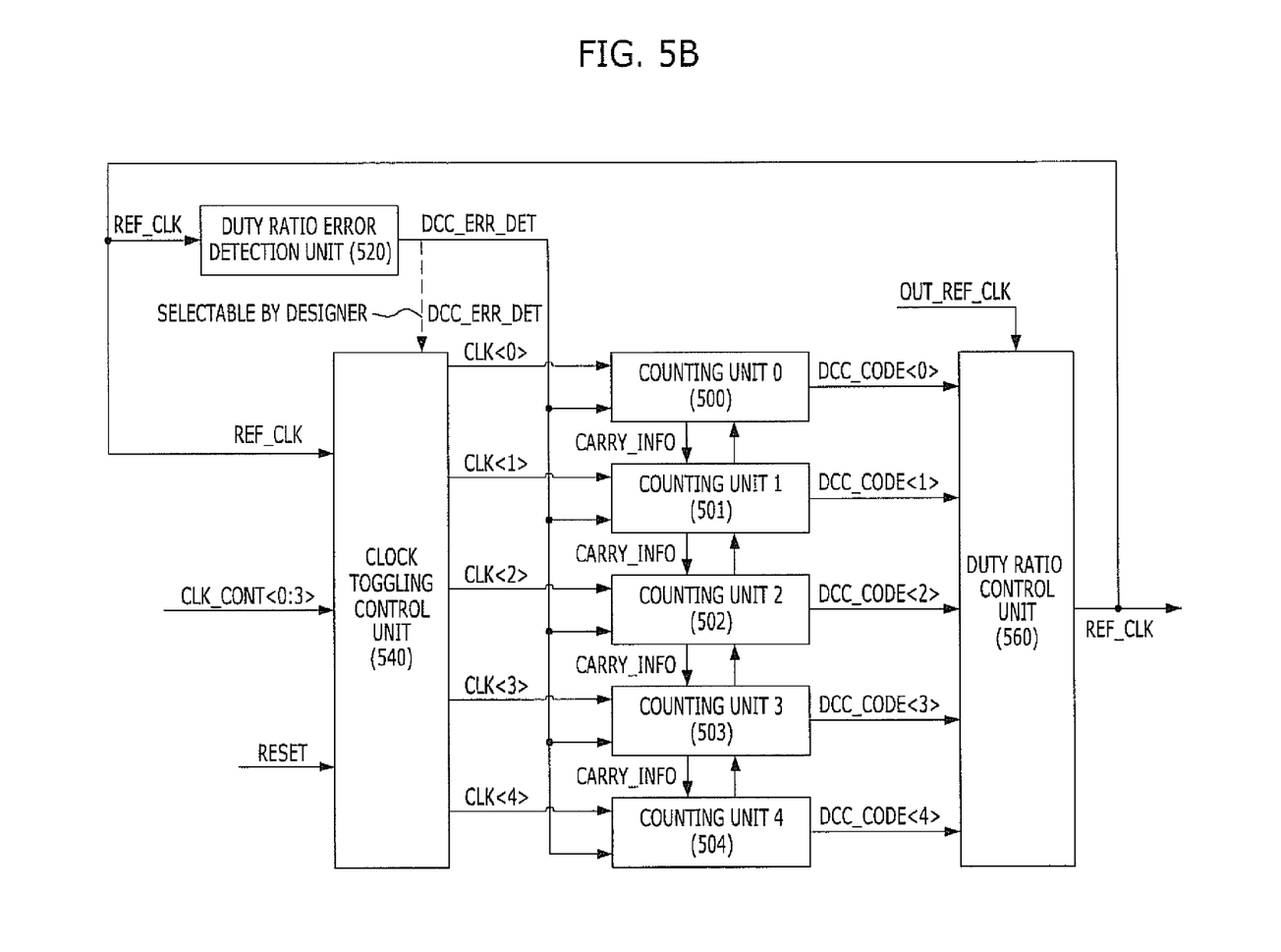
FIG. 5B is a block diagram showing a duty correction circuit of a semiconductor device in accordance with another embodiment of the present invention that is applied to the counting circuit of a semiconductor device shown in FIG. 5A.
Figure 6:
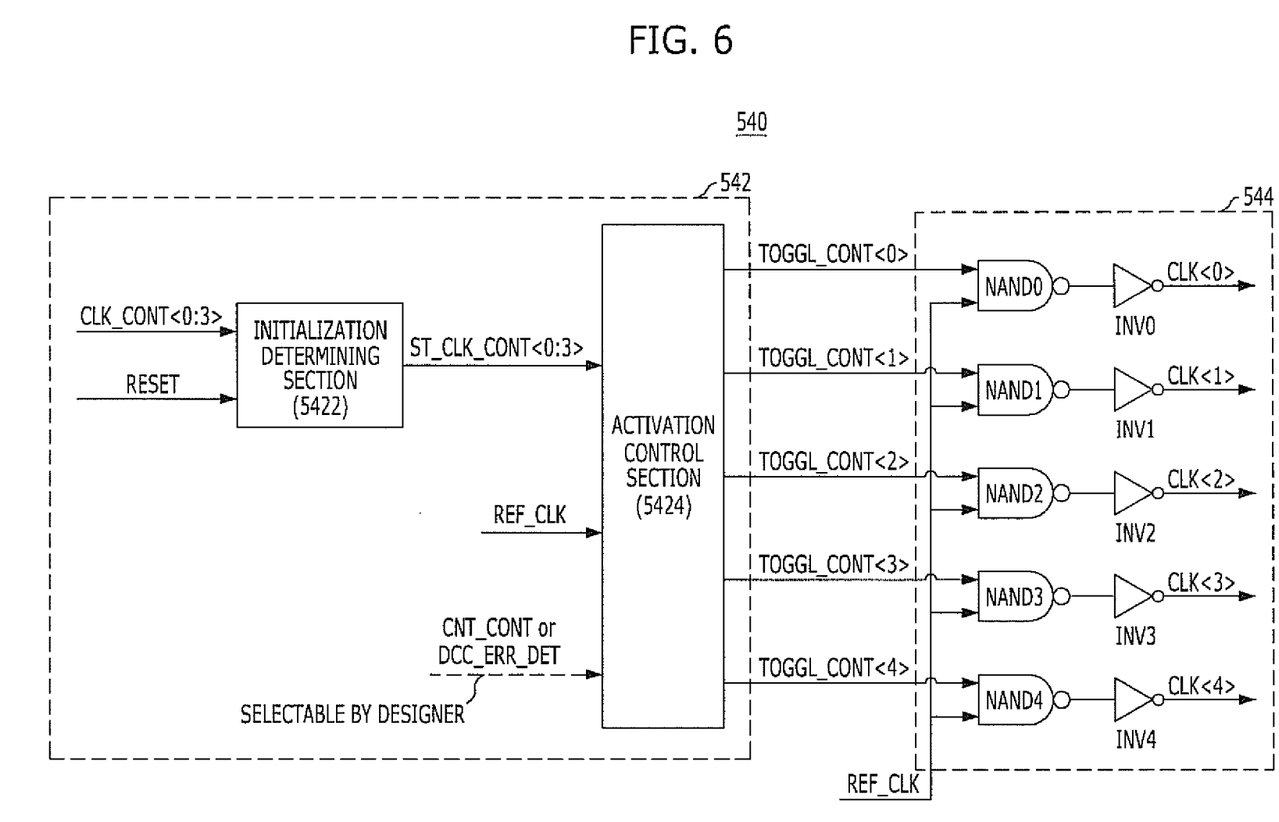
FIG. 6 is a block diagram showing the detailed configuration of a clock toggling control unit according to the embodiments shown in FIGS. 5A and 5B.

FIG. 5A is a block diagram showing a counting circuit of a semiconductor device in accordance with an embodiment of the present invention. FIG. 5B is a block diagram showing a duty correction circuit of a semiconductor device in accordance with another embodiment of the present invention. FIG. 6 is a block diagram showing a detailed configuration of a clock toggling control unit shown in FIGS. 5A and 5B.

First, referring to FIG. 5A, a counting circuit of a semiconductor device in accordance with an embodiment of the present invention includes a plurality of counting units 500, 501, 502, 503 and 504, a clock toggling control unit 540, and a counting operation control unit 580.

The counting units 500, 501, 502, 503 and 504 are configured to count the respective bits of counting codes CNT_CODE<0:4> in response to a plurality of counting clocks CLK<0:4>, respectively, in such a manner that a counting direction is controlled in response to a counting control signal CNT_CONT.

More specifically, the counting units 500, 501, 502, 503 and 504 respectively count the bits included in the counting codes CNT_CODE<0:4> in one-to-one correspondence to the counting clocks CLK<0:4>. Also, the counting units 500, 501, 502, 503 and 504 perform counting operations by combining carry information CARRY_INFO of adjoining units.

The clock toggling control unit 540 is configured to control the number of clocks that toggle among the counting clocks CLK<0:4> in response to clock control signals CLK_CONT<0:3>.

The clock toggling control unit 540 may be described according to the following two exemplary embodiments.

In the first exemplary embodiment, the clock toggling control unit 540 according to a first exemplary embodiment receives the clock control signals CLK_CONT<0:3>, a source clock REF_CLK, a RESET signal, and the counting control signal CNT_CONT.

More specifically, the clock toggling control unit 540 determines the number of clocks to toggle in an initial operation among the counting clocks CLK<0:4> according to the values of the clock control signals CLK_CONT<0:3> that are set in the initial operation and also the number of clocks to toggle after the initial operation. During a period when the counting control signal CNT_CONT is deactivated after the initial operation, the clock toggling control unit 540 sequentially causes the clocks that have not toggled to toggle. During a period when the counting control signal CNT_CONT is activated after the initial operation, the clock toggling control unit 540 causes all of the counting clocks CLK<0:4> to toggle.

The detailed configuration of the clock toggling control unit 540 according to the first embodiment will be described below with reference to FIG. 6. The clock toggling control unit 540 includes a toggling operation control signal generation part 542 configured to generate a plurality of toggling operation control signals TOGGL_CONT<0:4>. The clock toggling control unit 540 also includes a plurality of counting clock generation parts 544 configured to generate the counting clocks CLK<0:4> in response to the respective toggling operation control signals TOGGL_CONT<0:4> and the source clock REF_CLK. The toggling operation control signals TOGGL_CONT<0:4> are sequentially activated from a deactivated signal each time the source clock REF_CLK toggles during the period when the counting control signal CNT_CONT is deactivated. Also, the toggling operation control signals TOGGL_CONT<0:4> are all activated, or determined not to be active, during the period when the counting control signal CNT_CONT is activated in the initial operations of the respective toggling operation control signals TOGGL_CONT<0:4> in response to the clock control signals CLK_CONT<0:3>

The toggling operation control signal generation part 542 includes an initialization determining section 5422 and an activation control section 5424. The initialization determining section 5422 is configured to control the number of signals among the toggling operation control signals TOGGL_CONT<0:4> to be initialized to a deactivated state in response to the clock control signals CLK_CONT<0:3> and the reset signal RESET. The activation control section 5424 is configured to sequentially activate M (M is a natural number equal to or greater than 1) signals in the deactivated state among the toggling operation control signals TOGGL_CONT<0:4> each time toggling of the source clock REF_CLK is repeated N times (N is a natural number greater than 1) when the counting control signal CNT_CONT is deactivated. The initialization determining section 5422 activates all of the toggling operation control signals TOGGL_CONT<0:4> when the counting control signal CNT_CONT is activated.

The operations of the initialization determining section 5422 are described below in detail. When the reset signal RESET toggles, the initial values of the toggling operation control signals TOGGL_CONT<0:4> may correspond to the values of the clock control signals CLK_CONT<0:3> as in the following Table 1.

TABLE 1

| Clock control signals (CLK_CONT<0:3>) | Initial values of the toggling operation control signals (TOGGL_CONT<0:4>) |
| --- | --- |
| 0000 | 10000 |
| 1000 | 11000 |
| 1100 | 11100 |
| 1110 | 11110 |
| 1111 | 11111 |

As can be seen from Table 1, when the counting control signal CNT_CONT is maintained in the deactivated state with the values of the toggling operation control signals TOGGL_CONT<0:4> initialized, the activation control section 5424 sequentially activates the values (meaning the values initialized to 0) of the toggling operation control signals TOGGL_CONT<0:4> that are deactivated. However, where the counting control signal CNT_CONT is activated in the course of sequentially activating the values of the deactivated toggling operation control signals TOGGL_CONT<0:4>, the activation control section 5424 simultaneously activates the values of all the toggling operation control signals TOGGL_CONT<0:4>.

For example, when the initial values of the toggling operation control signals TOGGL_CONT<0:4> are '10000' and M is 1, and assuming that the counting control signal CNT_CONT is continually maintained in the deactivated state, the values of the toggling operation control signals TOGGL_CONT<0:4> may be changed in the sequence of '10000', '11000', '11100', '11110' and '11111' each time the source clock REF_CLK toggles N times. However, assuming that the counting control signal CNT_CONT is activated when the values of the toggling operation control signals TOGGL_CONT<0:4> is, for example, '11100', the values of the toggling operation control signals TOGGL_CONT<0:4> may be changed in the sequence of '10000', '11000', '11100' and '11111' each time the source clock REF_CLK toggles N times.

The counting clock generation parts 544 include a plurality of NAND gates NAND<0:4> and a plurality of inverters INV<0:4>. The NAND gates NAND<0:4> respectively receive the toggling operation control signals TOGGL_CONT<0:4> and receive the source clock REF_CLK. Accordingly, the counting clock generation parts 544 toggle and output the respective counting clocks CLK<0:4> corresponding to toggling of the source clock REF_CLK when the respective toggling operation control signals TOGGL_CONT<0:4> are applied in an activated state. Conversely, the counting clock generation parts 544 maintain the respective counting clocks CLK<0:4> in a deactivated state regardless of toggling of the source clock REF_CLK when the respective toggling operation control signals TOGGL_CONT<0:4> are applied in a deactivated state. The respective values of the toggling operation control signals TOGGL_CONT<0:4> are changed in synchronization with the edge of the source clock REF_CLK.

Second, the clock toggling control unit 540 according to a second exemplary embodiment is controlled by receiving only the clock control signals CLK_CONT<0:3>.

More specifically, the clock toggling control unit 540 determines the number of clocks among the counting clocks CLK<0:4> to toggle in an initial operation according to the values of the clock control signals CLK_CONT<0:3>, which are set in the initial operation. After the initial operation, the clock toggling control unit 540 sequentially toggles clocks among the counting clocks CLK<0:4> in that have not toggled and toggles all the counting clocks CLK<0:4> after the number of clocks toggling among the counting clocks CLK<0:4> is equal to or greater than a designated number.

The detailed configuration of the clock toggling control unit 540 according to the second embodiment will be described below with reference to FIG. 6. The clock toggling control unit 540 includes a toggling operation control signal generation part 542 configured to generate a plurality of toggling operation control signals TOGGL_CONT<0:4>. The clock toggling control unit 540 also includes a plurality of counting clock generation parts 544 configured to generate the counting clocks CLK<0:4> in response to the respective toggling operation control signals TOGGL_CONT<0:4> and the source clock REF_CLK. The toggling operation control signals TOGGL_CONT<0:4> are sequentially activated each time a source clock REF_CLK toggles. All of the toggling operation control signals TOGGL_CONT<0:4> are activated, or determined not to be activated, when the number of activated signals is equal to or greater than the designated number.

The toggling operation control signal generation part 542 includes an initialization determining section 5422 and an activation control section 5424. The initialization determining section 5422 is configured to control the number of signals among the toggling operation control signals TOGGL_CONT<0:4> to be initialized to a deactivated state in response to the clock control signals CLK_CONT<0:3> and a reset signal RESET. The activation control section 5424 is configured to sequentially activate M (M is a natural number equal to or greater than 1) signals in the deactivated state among the toggling operation control signals TOGGL_CONT<0:4> each time toggling of the source clock REF_CLK is repeated N times (N is a natural number greater than 1). The initialization determining section 5422 activates all of the toggling operation control signals TOGGL_CONT<0:4> when the number of signals activated among the toggling operation control signals TOGGL_CONT<0:4> is equal to or greater than the designated number.

The operations of the initialization determining section 5422 are described below in detail. When the reset signal RESET toggles, the initial values of the toggling operation control signals TOGGL_CONT<0:4> may correspond to the values of the clock control signals CLK_CONT<0:3> as in Table 1 given above.

As shown in Table 1, when the toggling operation control signals TOGGL_CONT<0:4> are initialized, the activation control section 5424 sequentially activates the values (meaning the values initialized to 0) of the toggling operation control signals TOGGL_CONT<0:4> that are deactivated. When the number of activated signals is equal to or greater than the designated number, the activation control section 5424 activates all the toggling operation control signals TOGGL_CONT<0:4>.

For example, the initial values of the toggling operation control signals TOGGL_CONT<0:4> may be '10000', M may be 1, and the designated number may be 3. The values of the toggling operation control signals TOGGL_CONT<0:4> may be changed in the sequence of '10000', '11000' and '11100'. However, since the source clock REF_CLK toggles N times and the number of activated signals becomes 3, the values of the toggling operation control signals TOGGL_CONT<0:4> are immediately changed in the sequence of '11100' to '11111'. Similarly, in a second example, the initial values of the toggling operation control signals TOGGL_CONT<0:4> may be '10000', M may be 1 and the designated number may be 2. The values of the toggling operation control signals TOGGL_CONT<0:4> may be changed in the sequence of '10000' and '11000'. Since the source clock REF_CLK toggles N times and the number of activated signals becomes 2, the values of the toggling operation control signals TOGGL_CONT<0:4> are immediately changed in the sequence of '11000' to '11111'.

The counting clock generation parts 544 include a plurality of NAND gates NAND<0:4>, and a plurality of inverters INV<0:4>. The NAND gates NAND<0:4> respectively receive the toggling operation control signals TOGGL_CONT<0:4> and receive the source clock REF_CLK. Accordingly, the counting clock generation parts 544 toggle and output the respective counting clocks CLK<0:4> corresponding to toggling of the source clock REF_CLK when the respective toggling operation control signals TOGGL_CONT<0:4> are applied in an activated state. Conversely, the counting clock generation parts 544 maintain the respective counting clocks CLK<0:4> in a deactivated state regardless of toggling of the source clock REF_CLK when the respective toggling operation control signals TOGGL_ CONT<0:4> are applied in a deactivated state. The respective values of the toggling operation control signals TOGGL_ CONT<0:4> are changed in synchronization with the edge of the source clock REF_CLK.

Referring again to FIG. 5A, the counting operation control unit 580 is configured to compare the value of target codes SOME_CODE<0:4> and the value of the counting codes CNT_CODE<0:4> and determine the value of the counting control signal CNT_CONT according to a comparison result.

More specifically, the counting operation control unit 580 deactivates the counting control signal CNT_CONT when the value of the counting codes CNT_CODE<0:4> is less than the value of the target codes SOME_CODE<0:4>. When the value of the counting codes CNT_CODE<0:4> is less than the value of the target codes SOME_CODE<0:4>, the counting operation control unit 580 sets the counting direction of the counting units 500, 501, 502, 503 and 504 to an increasing direction. The counting operation control unit 580 activates the counting control signal CNT_CONT when the value of the counting codes CNT_CODE<0:4> is greater than the value of the target codes SOME_CODE<0:4>. When the value of the counting codes CNT_CODE<0:4> is greater than the value of the target codes SOME_CODE<0:4>, the counting operation control unit 580 sets the counting direction of the counting units 500, 501, 502, 503 and 504 to a decreasing direction. The counting operation control unit 580 may be configured to operate in the opposite manner to the above-described operation, in that the counting direction of the counting units 500, 501, 502, 503, and 504 may be decreasing when the value of the counting control signal CNT_CONT is greater than the value of target codes CNT_CODE<0:4>, and the counting direction of the counting units 500, 501, 502, 503, and 504 may be increasing when the value of the counting control signal CNT_CONT is less than the value of target codes CNT_CODE<0:4>.

The value of the target codes SOME_CODE<0:4>, which serves as a comparison value to the counting codes CNT_CODE<0:4>, may be stored in a register such as an MRS so that the value can be set in advance and may be changed by a value changing operation.

An exemplary method of the changing the target codes SOME_CODE<0:4> is as follows.

A first operation changes the frequency of the source clock REF_CLK as the value of the counting codes CNT_CODE<0:4> varies, and the frequency of the source clock REF_CLK may be set so that the value of the counting codes CNT_CODE<0:4> corresponding to the target frequency of the source clock REF_CLK becomes the value of the target codes SOME_CODE<0:4>.

A second operation changes the phase of the source clock REF_CLK as the value of the counting codes CNT_CODE<0:4> varies, and the phase of the source clock REF_CLK may be set so that the value of the counting codes CNT_CODE<0:4> corresponding to the target phase of the source clock REF_CLK becomes the value of the target codes SOME_CODE<0:4>.

Referring to FIG. 5B, a duty correction circuit of a semiconductor device in accordance with another embodiment of the present invention is shown. In FIG. 5B, the counting circuit of the semiconductor device shown in FIG. 5A is applied is configured similarly to FIG. 5A, but with some differences. For example, the counting codes CNT_CODE<0:4> illustrated in FIG. 5A are replaced with duty correction codes DCC_CODE<0:4>, the counting operation control unit 580 is replaced with a duty cycle error detection unit 520, the counting control signal CNT_CONT is replaced with an output signal DCC_ERR_DET of the duty cycle error detection unit 520, and a duty cycle control unit 560 is added. The duty cycle control unit 560 is configured to control the duty cycle of an external source clock OUT_REF_CLK and generate a source clock REF_CLK.

The basic operations of the duty correction circuit of a semiconductor device shown in FIG. 5B correspond to those of the counting circuit of a semiconductor device shown in FIG. 5A. In FIG. 5B, an additional configuration is provided such that the duty correction codes DCC_CODE<0:4> determined through the counting circuit of a semiconductor device are used in a duty correction operation. Therefore, the configuration of the duty correction circuit of a semiconductor device will be described with reference to FIG. 5B.

Referring to FIG. 5B, the duty correction circuit of a semiconductor device in accordance with another embodiment of the present invention includes the duty cycle error detection unit 520, a plurality of counting units 500, 501, 502, 503 and 504, a clock toggling control unit 540, and the duty cycle control unit 560. The duty cycle error detection unit 520 is configured to detect a duty cycle error of the source clock REF_CLK. The counting units 500, 501, 502. 503, and 504 are configured to count the respective bits of the duty correction codes DCC_CODE<0:4> in response to a plurality of counting clocks CLK<0:4>, respectively. A counting direction of the counting units 500, 501, 502, 503 and 504 is controlled in response to the output signal DCC_ERR_DET of the duty cycle error detection unit 520. The clock toggling unit 540 is configured to control the number of clocks to toggle among the counting clocks CLK<0:4> in response to clock control signals CLK_CONT<0:3>. The duty cycle control unit 560 is configured to control the duty cycle of the source clock REF_CLK in response to the duty correction codes DCC_CODE<0:4>.

The counting units 500, 501, 502, 503 and 504 respectively count the bits included in the duty correction codes DCC_CODE<0:4> in one-to-one correspondence to toggling of the counting clocks CLK<0:4>. The counting units 500, 501, 502, 503 and 504 perform counting operations by combining carry information CARRY_INFO of adjoining units.

The duty cycle error detection unit 520 detects when the source clock REF_CLK is deactivated to a logic low level longer than when the source clock REF_CLK is activated to a logic high level. If the source clock REF_CLK has a longer low logic level than high logic level, the duty cycle error detection unit 520 deactivates the output signal DCC_ERR_DET. Further, the duty cycle error detection unit 520 detects when the source clock REF_CLK is deactivated to a logic low level shorter than when the source clock REF_CLK is activated to a logic high level. If the source clock REF_CLK has a shorter low logic level than high logic level, the duty cycle error detection unit 520 activates the output signal DCC_ERR_DET.

The duty cycle control unit 560 changes the duty cycle of the source clock REF_CLK by a larger amount if a value nearer to the most significant bit of the duty correction codes DCC_CODE<0:4> is activated, and the duty cycle control unit 560 changes the duty cycle of the source clock REF_CLK by a smaller amount if a value nearer to the least significant bit of the duty correction codes DCC_CODE<0:4> is activated. For example, the most significant bit may be the fifth bit of the duty correction codes DCC_CODE<0:4>, and the least significant bit may be the first bit of the duty correction codes DCC_CODE<0:4>. When the values of the respective bits of the duty correction codes DCC_CODE<0:4> vary in the sequence of the fifth bit DCC_CODE<4>, the fourth DCC_CODE<3>, the third bit DCC_CODE<2>, the second bit DCC_CODE<1>and the first bit DCC_CODE<0>, the relative duty cycle variation amount of the source clock REF_CLK is initially large but becomes small later.

Hereafter, operations of the duty correction circuit of a semiconductor device with the counting circuit applied thereto will be described below.

Figure 7:
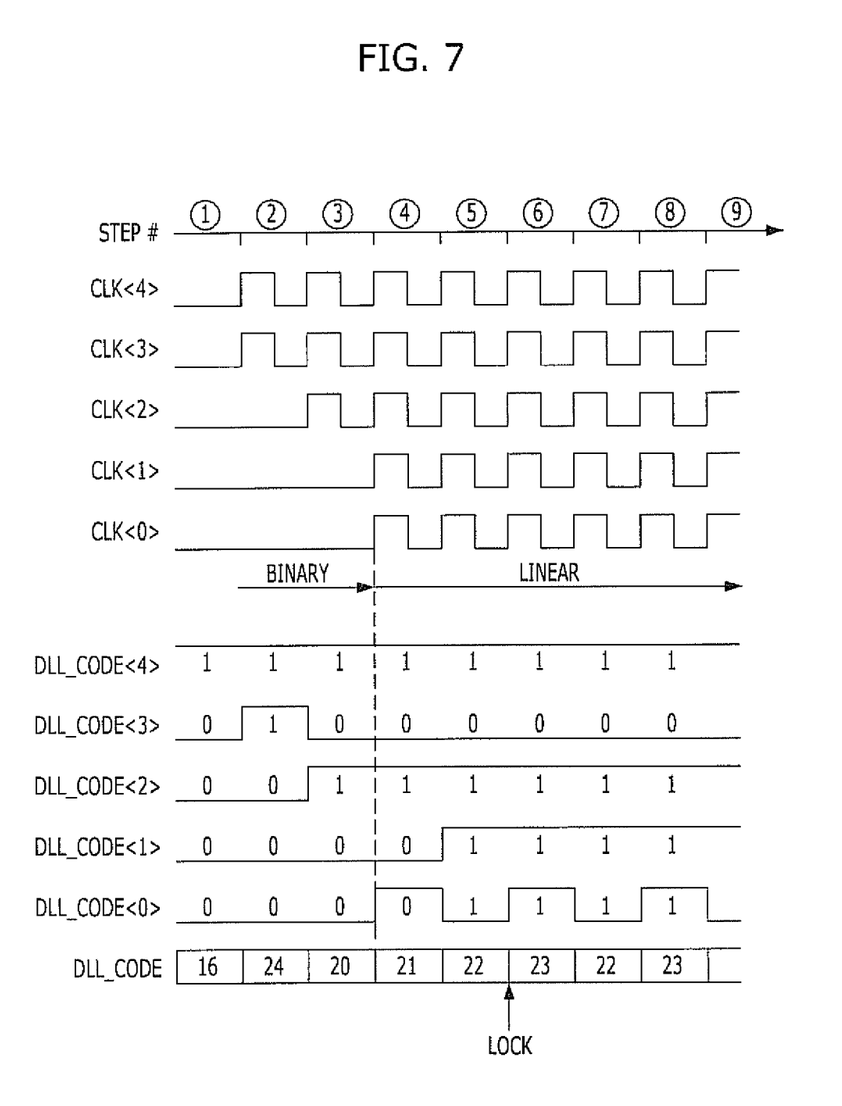
FIGS. 7 and 8 are timing diagrams explaining operations of the counting circuit of a semiconductor device and the duty correction circuit of a semiconductor device with the counting circuit applied thereto, according to the embodiments of the present invention shown in FIGS. 5A, 5B and 6.
Figure 8:
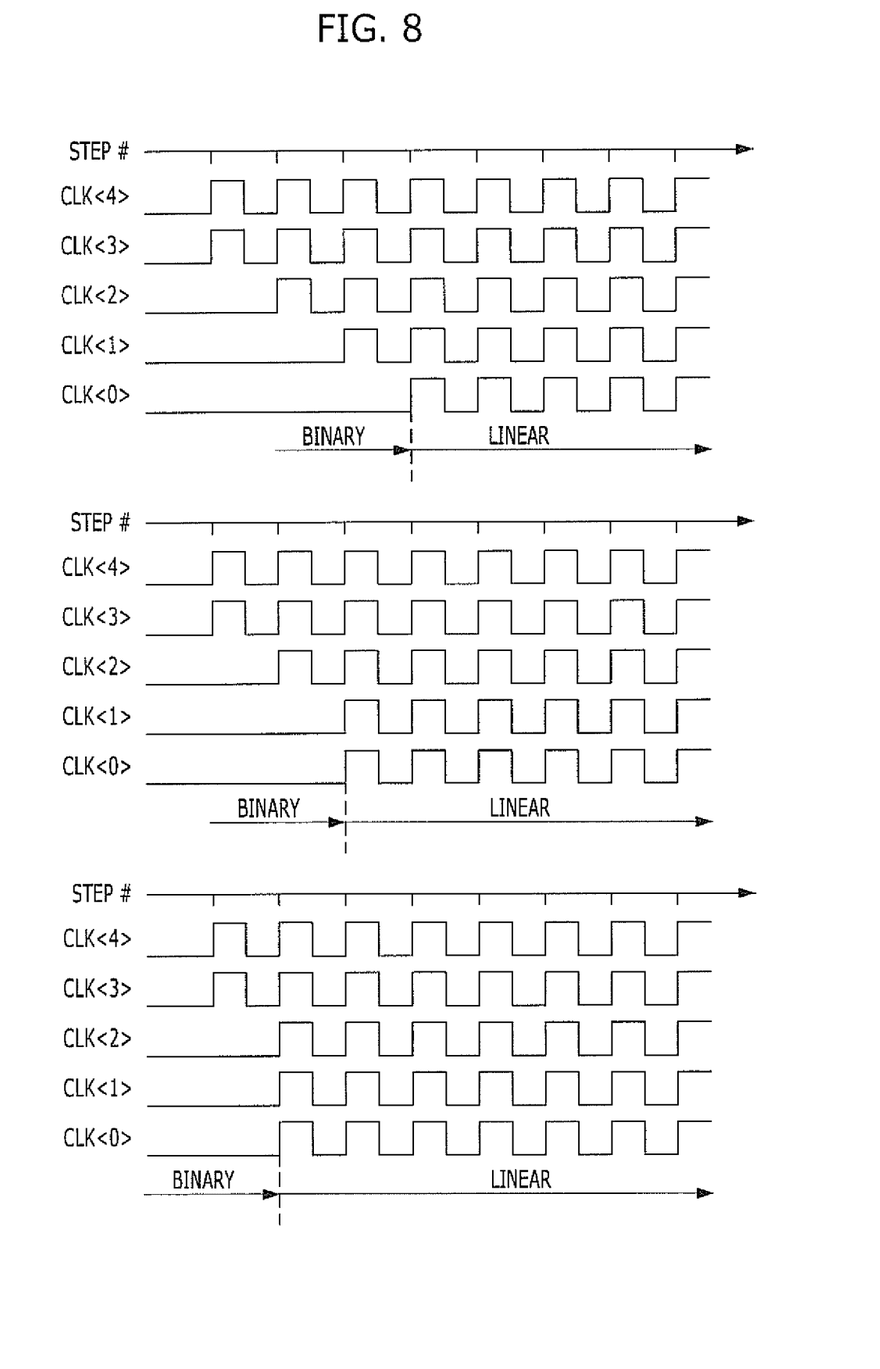

FIGS. 7 and 8 are timing diagrams explaining operations of the counting circuit of a semiconductor device and the duty correction circuit of a semiconductor device according to the embodiments of the present invention shown in FIGS. 5A, 5B and 6, Referring to FIG. 7, in an initializing operation ①, the values of the duty control codes DCC_CODE<0:4> are '10000'.

After the initializing operation ①, at a time ②, the source clock REF_CLK toggles for the first time. At time ②, the counting clock CLK<4>, which corresponds to the fifth bit DCC_CODE<4>, and the counting clock CLK<3>, which corresponds to the fourth bit DCC_CODE<3>, toggle, and the remaining counting clocks CLK<0:2> are maintained in deactivated states. Accordingly, the value of the fifth bit DCC_CODE<4> and the value of the fourth bit DCC_CODE<3> are changed to perform a duty correction operation. As a result, the values of the duty correction codes DCC_CODE<0:4> become '11000'.

At a time ③, the source clock REF_CLK toggles for the second time. The counting clock CLK<4>, which corresponds to the fifth bit DCC_CODE<4>, and the counting clocks CLK<3> and CLK<2>, which correspond to the fourth bit DCC_CODE<3> and the third bit DCC_CODE<2>, toggle, and the remaining counting clocks CLK<0:1> are maintained in deactivated states. Accordingly, the value of the fifth bit DCC_CODE<4> and the values of the fourth bit DCC_CODE<3> and the third bit close DCC_CODE<2> are changed to perform a duty correction operation. As a result, the values of the duty correction codes DCC_CODE<0:4> become '10100'.

At times ④, ⑤, ⑥, ⑦, ⑧ and ⑨ the source clock REF_CLK toggles for a third to a ninth time, and all of the counting clocks CLK<0:4> toggle. This change indicates that the counting circuit of a semiconductor device converts from the binary search method into the linear search method because the output signal DCC_ERR_DET of the duty cycle error detection unit 520 is changed from a deactivated state into an activated state. When the output signal DCC_ERR_DET changes from a deactivated to an activated state depends on the settings of the MRS. Hence, a duty correction operation is performed to change all the bits of the duty correction codes DCC_CODE<0:4>, and as a result, the values of the duty correction codes DCC_CODE<0:4> sequentially become '10101', '10110', '10111', '10110' and '10111'. The change of all the bits of the duty correction codes DCC_CODE<0:4> means that the duty correction operation is performed in such a way as to change the values of the duty correction codes DCC_CODE<0:4> starting from the least significant bit.

In this way, in the duty correction circuit of a semiconductor device, the respective bits of the duty correction codes DCC_CODE<0:4> may be changed independently of one another by controlling the number of clocks that toggle among the counting clocks CLK<0:4> based on the situation, Thus, a method for changing the duty correction codes DCC_CODE<0:4> allows the duty correction circuit to freely change between the binary search method and the linear search method.

Referring to FIG. 8, in the duty correction circuit of a semiconductor device in accordance with the embodiments of the present invention, while the toggling of the source clock REF_CLK proceeds, the number of clocks to toggle among the counting clocks CLK<0:4> may be freely controlled. Accordingly, the period that the values of the duty correction codes DCC_CODE<0:4> are changed according to the binary search method and the period that the values of the duty correction codes DCC_CODE<0:4> are changed according to the linear search method may be freely controlled.

Figure 9:
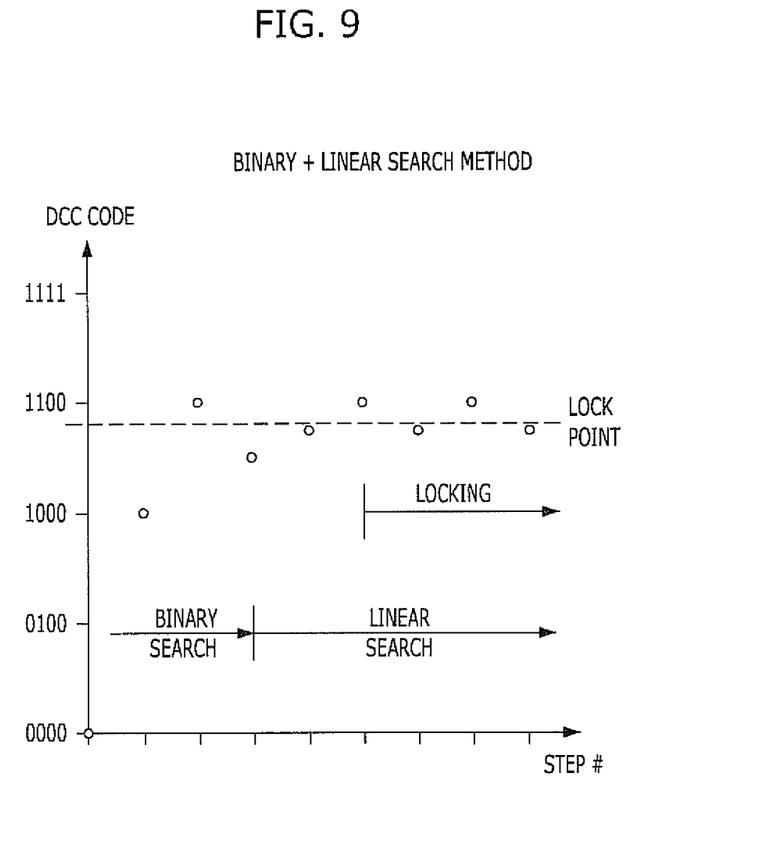
FIG. 9 is a graph explaining that the values of duty correction codes change according to the operations of the counting circuit of a semiconductor device and the duty correction circuit of a semiconductor device with the counting circuit applied thereto, according to the embodiments of the present invention shown in FIGS. 5A, 5B and 6.

FIG. 9 is a graph explaining that the values of duty correction codes change according to the operations of the counting circuit of a semiconductor device and the duty correction circuit of a semiconductor device with the counting circuit applied thereto, according to the embodiments of the present invention shown in FIGS. 5A, 5B and 6.

Referring to FIG. 9, as the duty correction circuit of a semiconductor device in accordance with the embodiments of the present invention operates, the amount that the values of the duty correction codes DCC_CODE<0:4> are changed is large initially because the values of the duty correction codes DCC_CODE<0:4> are changed using the binary search method. Hence, an amount that the duty cycle of the source clock REF_CLK is changed is also large.

Thereafter, the amount that the values of the duty correction codes DCC_CODE<0:4> are changed is small because the values of the duty correction codes DCC_CODE<0:4> are changed using the linear search method. Hence, an amount that the duty cycle of the source clock REF_CLK is changed is also small.

According to the embodiments of the present invention, various methods for changing the values of counting codes until the values reach target values can be used, and more specifically, a linear search method and a binary search method can be selectively used in the same circuit.

As a consequence, it is possible to take the advantages of the binary and linear search method until the values reach target values, and the probability of an error to occur during an operation may be minimized.

While the present invention has been described with respect to the specific embodiments, it will be apparent to those skilled in the art in that various changes and modifications may be made without departing from the spirit and scope of the invention as defined in the following claims.

For example, the positions and types of logic gates and transistors exemplified in the aforementioned embodiments should be differently realized depending upon the polarities of the signals inputted thereto.

What is claimed is:

1. A counting circuit of a semiconductor device, comprising:
    a plurality of counting units configured to count respective bits of counting codes in response to a plurality of counting clocks, respectively, and to control a counting direction in response to a counting control signal;
    a clock toggling control unit configured to control the number of counting clocks that toggle among the plurality of counting clocks in response to clock control signals; and
    a counting operation control unit configured to compare a value of target value codes and a value of the counting codes, and to determine a value of the counting control signal according to a comparison result.

2. The counting circuit of claim 1, wherein the plurality of counting units respectively count the plurality of bits included in the counting codes in one-to-one correspondence to the plurality of counting clocks.

3. The counting circuit of claim 2, wherein the plurality of counting units respectively perform counting operations by combining carry information between adjoining units.

4. The counting circuit of claim 1,
    wherein the clock toggling control unit determines the number of counting clocks to toggle in an initial operation among the plurality of counting clocks according to values of the clock control signals that are set in the initial operation,
    wherein, during a period in which the counting control signal is deactivated after the initial operation, the clock toggling control unit sequentially toggles counting clocks that have not toggled among the plurality of counting clocks, and
    wherein, during a period in which the counting control signal is activated after the initial operation, the clock toggling control unit toggles all of the plurality of counting clocks.

5. The counting circuit of claim 4, wherein the clock toggling control unit comprises:
    a toggling operation control signal generation part configured to generate a plurality of toggling operation control signals,
    wherein the plurality of toggling operation control signals, in the initial operations of the respective toggling operation control signals, are sequentially activated by the toggling operation control signal generation part starting from a deactivated signal each time a source clock toggles during the period in which the counting control signal is deactivated in response to the clock control signals;
    wherein the plurality of toggling operation control signals, in the initial operations of the respective toggling operation control signals, are all activated by the toggling operation control signal generation part during the period in which the counting control signal is activated;
    wherein the toggling operation control signal generation part determines whether or not to activate the plurality of toggling operation control signals in response to the clock control signals; and
    a plurality of counting clock generation parts configured to generate the plurality of counting clocks in response to the respective toggling operation control signals and the source clock.

6. The counting circuit of claim 5, wherein the toggling operation control signal generation part comprises:
    an initialization determining section configured to control the number of toggling operation control signals to be initialized to a deactivated state among the plurality of toggling operation control signals in response to the clock control signals and a reset signal; and
    an activation control section configured to sequentially activate at least one toggling operation control signals in the deactivated state among the plurality of toggling operation control signals each time toggling of the source clock is repeated at least one time during the period in which the counting control signal is deactivated, and activate all of the plurality of toggling operation control signals during the period in which the counting control signal is activated.

7. The counting circuit of claim 1,
    wherein the clock toggling control unit determines the number of counting clocks to toggle in an initial operation among the plurality of counting clocks according to values of the clock control signals that are set in the initial operation, and
    wherein, after the initial operation, the clock toggling control unit sequentially toggles counting clocks that have not toggled among the plurality of counting clocks, and toggles all the plurality of counting clocks from a time an operation defined number of counting clocks toggle.

8. The counting circuit of claim 7, wherein the clock toggling control unit comprises:
    a toggling operation control signal generation part configured to generate a plurality of toggling operation control signals,
    wherein the plurality of toggling operation control signals, in initial operations of the respective toggling operation control signals, are sequentially activated by the toggling operation control signal generation part starting from a deactivated signal each time a source clock toggles;
    wherein all of the plurality of toggling operation control signals, in the initial operations of the respective toggling operation control signals, are activated when the number of activated toggling operation control signals is equal to or greater than an operation defined number in response to the clock control signals;

wherein the toggling operation control signal generation part determines whether or not to activate the plurality of toggling operation control signals in response to the clock control signals; and a plurality of counting clock generation parts configured to generate the plurality of counting clocks in response to the respective toggling operation control signals and the source clock.

9. The counting circuit of claim 8, wherein the toggling operation control signal generation part comprises:

an initialization determining section configured to control the number of toggling operation control signals to be initialized to a deactivated state, among the plurality of toggling operation control signals in response to the clock control signals and a reset signal; and an activation control section configured to sequentially activate at least one toggling operation control signal in the deactivated state among the plurality of toggling operation control signals each time toggling of the source clock is repeated at least one time, and activate all of the plurality of toggling operation control signals when the number of toggling operation control signals activated among the plurality of toggling operation control signals is equal to or greater than the operation defined number.

10. The counting circuit of claim 5, wherein the plurality of counting clock generation parts toggle and output the respective counting clocks in correspondence to toggling of the source clock when the respective toggling operation control signals are applied in an activated state, and maintain the respective counting clocks outputted in a deactivated state regardless of toggling of the source clock when the respective toggling operation control signals are applied in a deactivated state.

11. The counting circuit of claim 5, wherein the respective values of the plurality of toggling operation control signals are changed in synchronization with an edge of the source clock.

12. The counting circuit of claim 1, wherein the counting operation control unit deactivates the counting control signal when the value of the counting codes is less than the value of the target codes and sets a counting direction of the plurality of counting units to an increasing direction; and wherein the counting control unit activates the counting control signal in the case where the value of the counting codes is greater than the value of the target codes and thereby sets the counting direction of the plurality of counting units to a decreasing direction.

13. The counting circuit of claim 12, wherein the value of the target codes is stored in a register and may be changed through a target code changing operation.

14. The counting circuit of claim 13, wherein the target code changing operation is an operation of changing a frequency of the source clock as the value of the counting codes varies, and the value of the counting codes corresponding to a target frequency of the source clock becomes the value of the target codes.

15. The counting circuit of claim 13, wherein the target code changing operation is an operation of changing a phase of the source clock as the value of the counting codes varies, and the value of the counting codes corresponding to a target phase of the source clock becomes the value of the target codes.

16. A method for operating a counting circuit of a semiconductor device, comprising:

initializing toggling by toggling an initial number of counting clocks selected among a plurality of counting clocks according to clock control signals corresponding to a source clock and deactivating remaining counting clocks;

performing a toggling operation by toggling sequentially counting clocks in a deactivated state by the initializing of the toggling among the plurality of counting clocks each time the number of toggling times of the source clock reaches a operation defined number and by toggling all of the plurality of counting clocks when a preset condition is satisfied;

counting respective bits of counting codes in response to the plurality of counting clocks, respectively, the counting codes being selected in a counting direction thereof according to a counting control signal; and comparing a value of the counting codes and a value of target codes and determining a value of the counting control signal according to a comparison result.

17. The method of claim 16, wherein, the respective bits of the counting codes are counted by combining carry information of adjoining bits.

18. The method of claim 16, wherein the source clock and the plurality of counting clocks are synchronized with each other and have the same frequency.

19. The method of claim 16, wherein the determining of the value of the counting control signal comprises:

deactivating the counting control signal when the value of the counting codes is less than the value of the target codes and counting is implemented in a counting direction of increasing the value of the counting codes; and activating the counting control signal i when the value of the counting codes is greater than the value of the target codes and counting is implemented in a counting direction of decreasing the value of the counting codes.

20. The method of claim 19, wherein the value of the target codes is stored in a register and may be changed through a target code changing operation.

21. The method of claim 20, wherein the target code changing operation comprises changing a frequency of the source clock as the value of the counting codes varies, and the value of the counting codes corresponding to a target frequency of the source clock becomes the value of the target codes.

22. The method of claim 20, wherein the target code changing operation comprises changing a phase of the source clock as the value of the counting codes varies, and the value of the counting codes corresponding to a target phase of the source clock becomes the value of the target codes.

23. The method of claim 16, wherein the preset condition in the toggling operation transitions the counting control signal from a deactivated state to an activated state.

24. The method of claim 16, wherein the preset condition in the toggling operation the toggles number of counting clocks among the plurality of counting clocks to equal to or greater than a operation defined number.

* * * * *